(12) United States Patent
Beit-Grogger et al.

(10) Patent No.: US 6,962,294 B2
(45) Date of Patent: Nov. 8, 2005

(54) INTEGRATED CIRCUIT HAVING AN ACTIVE SHIELD

(75) Inventors: Andrea Beit-Grogger, Graz (AT); Josef Riegebauer, Ilz (AT)

(73) Assignee: Infineon Technologie AG, Munich (DE)

( * ) Notice: Subject to any disclaimer, the term of this patent is extended or adjusted under 35 U.S.C. 154(b) by 0 days.

(21) Appl. No.: 10/995,961

(22) Filed: Nov. 22, 2004

(65) Prior Publication Data

US 2005/0092848 A1    May 5, 2005

Related U.S. Application Data

(63) Continuation of application No. PCT/DE03/01357, filed on Apr. 25, 2003.

(30) Foreign Application Priority Data

May 24, 2002  (DE) ............................. 102 23 176

(51) Int. Cl.[7] .......................................... G06K 19/06
(52) U.S. Cl. .................................... 235/492; 235/487
(58) Field of Search ............... 235/492, 441, 235/451, 487

(56) References Cited

U.S. PATENT DOCUMENTS

| | | | |
|---|---|---|---|
| 4,868,489 A | 9/1989 | Kowalski | |
| 5,060,261 A * | 10/1991 | Avenier et al. | 713/194 |
| 5,247,577 A | 9/1993 | Bailey et al. | |
| 5,465,349 A * | 11/1995 | Geronimi et al. | 714/30 |
| 6,246,970 B1 | 6/2001 | Silverbrook et al. | |
| 6,565,007 B1 * | 5/2003 | Kreft | 235/492 |
| 6,752,321 B1 * | 6/2004 | Leaming | 235/492 |
| 6,798,234 B2 * | 9/2004 | Laackmann et al. | 326/21 |
| 6,805,297 B2 * | 10/2004 | Okaue et al. | 235/492 |
| 2001/0033012 A1 | 10/2001 | Kommerling et al. | |

FOREIGN PATENT DOCUMENTS

| | | |
|---|---|---|
| DE | 100 58 078 C1 | 4/2002 |
| WO | WO-98/18102 A1 | 4/1998 |
| WO | WO-02/17398 A1 | 2/2002 |

OTHER PUBLICATIONS

Verbauwhede, I. et al.; "ASIC Cryptographical processor based on DES"; EURO ASIC '91 Paris, France, May 27-31, 1991, Los Alamitos, CA, USA, IEEE Comput. Soc, US. pp. 292-295, XP010024405.

* cited by examiner

*Primary Examiner*—Daniel StCyr
(74) *Attorney, Agent, or Firm*—Darby & Darby

(57) ABSTRACT

Integrated circuit having security-critical circuit components arranged in a lower plane, data lines arranged in an upper plane, situated at least in part above the security-critical circuit components arranged in the lower plane, and connected to the security-critical circuit components, and a detector circuit that identifies an attack on the integrated circuit. The detector circuit has a transmitting device that transmits predetermined test data into the security-critical circuit components arranged in the lower plane, a receiving device that receives the data processed by the security-critical circuit components arranged in the lower plane, and an evaluation device that compares the received data with expected data and that ascertains any non-correspondence. The data lines carry the predetermined test data that is transmitted by the transmitting device and is processed by the security-critical circuit components.

12 Claims, 2 Drawing Sheets

INTEGRATED CIRCUIT HAVING AN ACTIVE SHIELD

CROSS-REFERENCE TO RELATED APPLICATION

This application is a continuation of International Patent Application Serial No. PCT/DE2003/01357, filed Apr. 25, 2003, which published in German on Dec. 4, 2003 as WO 2003/100857, and is incorporated herein by reference in its entirety.

FIELD OF THE INVENTION

The invention relates to an integrated circuit having a plurality of physical planes, security-critical circuit components arranged in a lower plane and data lines arranged in an upper plane in such a way that they are situated at least in part above the security-critical circuit components.

BACKGROUND OF THE INVENTION

In principle, integrated circuits are constructed in such a way that the actual semiconductor components are arranged in a lower plane, the so-called active plane. The wiring of the semiconductor components is implemented in planes lying further above, the so-called metal planes. Depending on the complexity of the circuit, a plurality of metal planes is required in order to carry out a complete wiring. The individual metal planes are electrically isolated from one another by an insulation line. In general, attempts are made to keep the number of metal planes as low as possible, since each additional metal plane leads to a considerable increase in costs in the production of the integrated circuit.

Further requirements are made of integrated circuits which comprise security-critical circuit components. These relate to the repulse of attacks an the integrated circuit, the aim of these attacks being to covertly discover the internal processes in the security-critical circuit components or the construction thereof and thus to obtain the opportunities for manipulation or for unauthorized operations. Such attacks are known as probing, forcing, FIB, etc.

In especially security-critical cases, the affected regions are covered with an active shield and, if appropriate, an additional metal plane is provided for this in the case of an active shield, regions of a circuit are covered with a multiplicity of additional lines for which voltage and/or current flow are monitored in order to be able to detect a physical attack. A particularly critical application is present for example in an integrated circuit for DES implementation. In this application, the keys used are stored, in plain text. If an attacker succeeds in physically accessing the security-critical circuit components, the attacker can read out the keys and use them improperly.

An additional property of an integrated circuit for DES encryption that makes the construction more difficult lies in the fact that DES is very wiring-intensive owing to the many permutations. Therefore, a plurality of metal planes have to be provided anyway in order to avoid power and timing problems which result if it is attempted to dispense with a metal plane. Moreover, this would lead to enlargement of the area. The function of an active shield is nevertheless indispensable in order to ensure the security that is necessary for the application.

SUMMARY OF THE INVENTION

Therefore, it is an object of the invention to specify an integrated circuit which ensures the security of an active shield without requiring an additional metal plane for this.

This object is achieved by means of an integrated circuit of the type mentioned in the introduction which is characterized in that a detector circuit is provided for identifying an attack on the integrated circuit, having a transmitting device for feeding predetermined test data into the security-critical circuit components, a receiving device for receiving the first data processed by the security-critical circuit components, and an evaluation device for comparing the received data with expected data and for ascertaining a non-correspondence, the data lines carrying data that are necessary during the processing of the data fed in.

Thus, in the integrated circuit according to the invention, data lines present anyway are used to construct an active shield. In the event of an attack on the integrated circuit, firstly the data lines located at the top are affected. This would have the effect that the received data do not correspond to those data which are actually expected. In this case, the data lines may carry the first data to be processed themselves or data that have already been processed, or else second data required for processing. In the case of an integrated circuit for carrying out an encryption, the data lines carry the encrypted data or second data which are required for the encryption.

In a particularly advantageous embodiment of the invention, known test data are encrypted using a known test key. The form of the data to be obtained is thus known. In this case, the provision and plausibility check may be effected both by a control unit outside the encryption unit and by the encryption unit itself If the plausibility check gives an incorrect outcome, further use of the encryption unit is no longer permitted, or countermeasures are initiated.

In this case, the data lines connect an encryption memory, in which second data that are necessary for encrypting first data are stored or can be stored, to processing units for combining the first with the second data and a key. There are a large number of such lines present, so that a high security is achieved. Consequently, the test circuit according to the invention can be integrated into the rest of the circuit design particularly simply.

Particularly in the case of cyclic transmission of test data, it is possible to provide a security function which corresponds to that of an active shield. No additional metal plane is necessary in this case.

BRIEF DESCRIPTION OF THE DRAWINGS

The invention is explained in mare detail below using an exemplary embodiment. In the figures.

DETAILED DESCRIPTION OF PREFERRED EMBODIMENTS OF THE INVENTION

Figure 1:
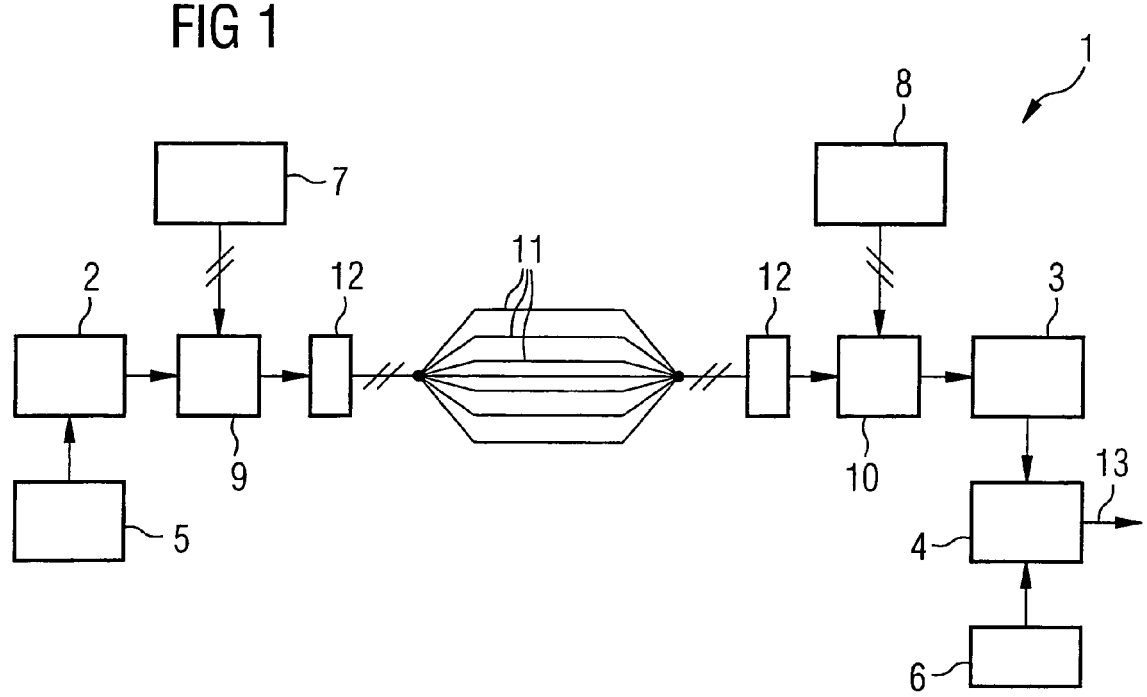
FIG. 1 shows a block diagram of an integrated circuit according to the invention in a first exemplary embodiment.

FIG. 1 illustrates an integrated circuit 1 having a test circuit according to the invention. Usually, data are transmitted from a first regular circuit component 7 via a data line 11 to a second regular circuit component 8. Generally, the data line is not, of course, a single line but rather a multiplicity of data lines, as is also illustrated in FIG. 1.

In order to be able to use the existing data lines 11 for the test purposes intended according to the invention, two changeover devices 9 and 10 are provided on both sides of the data lines. Instead of data being fed in by the first regular circuit components 7, it is possible, by means of a corresponding changeover of the first changeover device 9, for data to be fed into the data lines 11 by a transmitting device 2 assigned to the detector circuit. Predetermined test data 5 known within the integrated circuit are used for this purpose.

On the other side of the data lines 11, the data are forwarded to a receiving device 3, instead of to the second regular circuit components 8, by means of a second changeover device 10. An evaluation device 4 connected to the receiving device 3 compares the received data with expected data which should be received in the case of an intact transmission path. If the evaluation device 4 ascertains that the received data do not correspond to the expected data, an alarm signal 13 is output. This can be used to trigger countermeasures.

Further circuit components 12, for example encryption components, may also be arranged in each case between the data lines 11 and the changeover devices 9 and 10. The components may be provided either on one side of the data lines or else on both sides. If an encryption document is provided, then the test data are encrypted using a known key, so that, at the receiver end, it can again be ascertained whether the received data correspond to expected data. In this case, the comparison can be effected without previously decrypting the data again.

Figure 2:
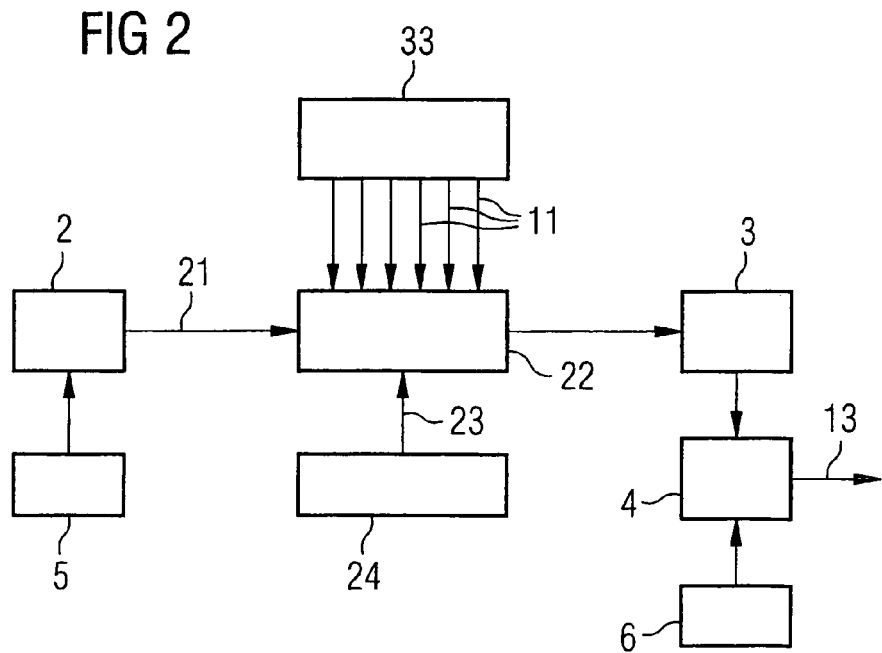
FIG. 2 shows a block diagram of a second exemplary embodiment.

FIG. 2 shows a second exemplary embodiment. In this exemplary embodiment, the first data to be processed are not themselves transmitted via the data lines that are to be used as an active shield, rather second data, which are necessary for the processing of the first data, are carried via the data lines 11. Without second data transmitted correctly via the data lines 11, correct processing of the first data fed in is not possible. The second data have no relevance to security, however.

The simplest way of explaining the exemplary embodiment of FIG. 2 is to assume that an encryption unit is involved. In this case, the first data 21 to be encrypted are combined, in an encryption unit 22, with second data which are stored in a memory 33 and are transmitted via the data lines 11 to the encryption unit 22. While the transmission of the first data 21 to be encrypted is effected on just a few parallel lines, 2048 parallel lines, for example, are present for the transmission of the second data. As a result, it is possible to obtain a significantly better shield effect than when using only the lines for the data 21 to be encrypted. In this case, only comparatively minor changes to existing circuit layouts have to be made for the invention's implementation of the function of an active shield.

The test data 5 are thus fed to the encryption unit 22 by a transmitting device 2, in which unit combination with the second data from the memory 33 and a test key 23, stored in a key register 24, is effected. The encrypted data are then fed to a receiving device 3. An evaluation device 4 connected to the latter compares the received data with expected data 6. If these do not correspond, it is assumed that manipulations to the data lines 11 have been made. In order to indicate this, an alarm signal 13 is output, and can be used to trigger countermeasures. By way of example, it may be expedient for the keys stored in the key register 24 to be erased when an alarm signal occurs.

Further countermeasures are familiar to the person skilled in the art and can be integrated without any problem.

Figure 3:
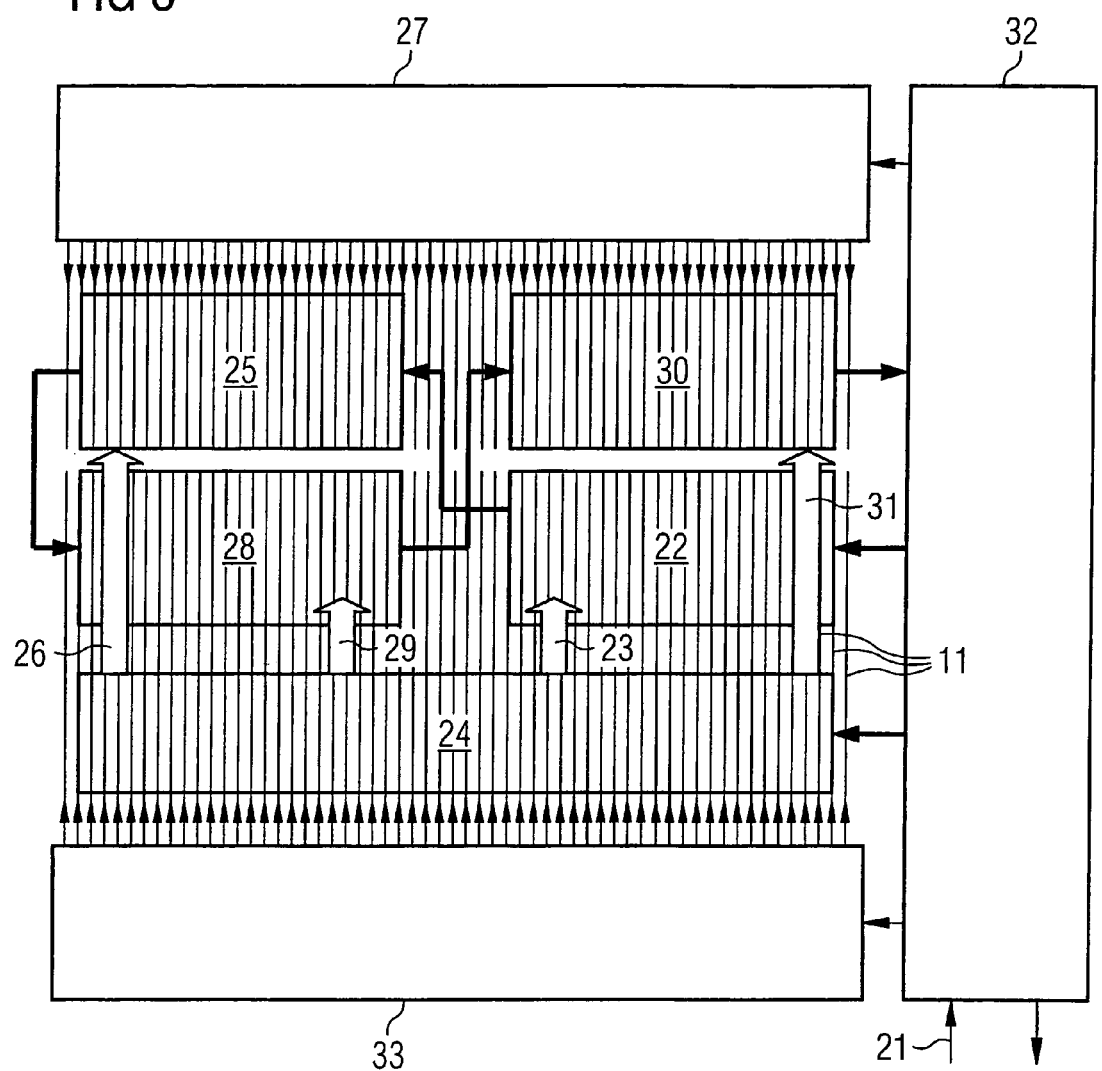
FIG. 3 shows a more detailed illustration of the block diagram of FIG. 2 using a DES encryption unit.

FIG. 3 shows, using the concrete example of a DES encryption unit, the spatial arrangement of the components used for encryption and of the data lines which are used as an active shield. The first data 21 to be encrypted, which may also be the test data 5, are fed to an interface device 32, which undertakes the input and output control. The first data are then fed to a first so-called "S-box selector" 22, which forms an encryption unit, where the data are combined with a first key 23, provided by a key register 24. The data which are combined are determined by second data in a first "S-box memory" 33. These data thus have to be transmitted from the first S-box memory 33 to the first S-box selector 22 by means of data lines 11. The arrangement of the first S-box selector 22, of the first S-box memory 33, of the key register 24 and of the data lines 11 is chosen such that the key register 24 lies below the data lines 11. The second data stored in the first S-box memory 33 are predetermined and prescribed by the DES standard in the case of a DES encryption unit. Of course, it is also possible to use application-specific second data for the encryption.

Proceeding from the first S-box selector 22, the first data, which have now already been partly processed, are transmitted to a second S-box selector 25, where a combination of the data that have already been partly encrypted with a further key 26, loaded from the key register 24, and second data from a second S-box memory 27 is carried out in the same way. Identical processes take place in a third S-box selector 28 and a fourth S-box selector 30, keys 29 and 31 respectively being used, loaded from the key register 24. Afterwards, the data are transferred to the interface device 32 and can be read out there.

It becomes clear from FIG. 3 that all security-relevant circuit components, namely the S-box selectors and the key register 24, are covered by data lines 11. The second data transmitted via these lines are indispensable for obtaining a correct encryption result. An attack on the data lines 11 leads to an incorrect encryption result, which is identified by an evaluation device, which is not illustrated in FIG. 3 but has already been described with reference to FIG. 2. An alarm signal to be output there can be used to trigger countermeasures.

The processing of test data and a test key described with reference to FIG. 3 accordingly leads to the same high security standard as the use of an additional active shield in a further metal plane.

FIG. 3 does not illustrate where the test data are fed in and where they are read out. The simplest solution is to do this at the interference device 32. However, it is left to the person skilled in the art also to use other nodes for this within the circuit.

In order to obtain good protection, the transmission of test data must take place at cyclic intervals. The shorter the intervals, the higher the protection. In this case, carrying out a transmission of test data at irregular intervals, for example under the control of a random generator, may be taken into consideration. This makes it more difficult for an attacker to utilize the intervals between the "shield checks". In this case, the test data may be transmitted in a manner triggered by hardware or software, depending on the application.

What is claimed is:

1. An integrated circuit comprising:
   security-critical circuit components arranged in a lower plane;
   data lines arranged in an upper plane, situated at least in part above the security-critical circuit components arranged in the lower plane, and connected to the security-critical circuit components; and a detector circuit that identifies an attack on the integrated circuit, comprising:
  a transmitting device that transmits predetermined test data into the security-critical circuit components arranged in the lower plane;
  a receiving device that receives the data processed by the security-critical circuit components arranged in the lower plane; and
  an evaluation device that compares the received data with expected data and that ascertains any non-correspondence,
wherein the integrated circuit is operable in a normal mode and a test mode,
the data lines carry the predetermined test data that is transmitted by the transmitting device and is processed by the security-critical circuit components in the test mode, and
the data lines carry data that is processed by the security critical circuit components in the normal mode.

2. The integrated circuit according to claim 1, wherein the security-critical circuit components are parts of an encryption device.

3. The integrated circuit according to claim 2, wherein the encryption device is a DES encryption device.

4. The integrated circuit according to claim 1, wherein the transmitter transmits the predetermined test data in cyclic intervals.

5. The integrated circuit according to claim 1, wherein the transmitter transmits the predetermined test data at irregular time intervals.

6. An integrated circuit comprising:
security-critical circuit components arranged in a lower plane, and which are parts of an encryption device;
data lines arranged in an upper plane, situated at least in part above the security-critical circuit components arranged in the lower plane, and connected to the security-critical circuit components;
a memory, in which second data that is necessary to encrypt first data is stored, connected by the data lines to processing units, which combine the first data with the second data and a key; and
a detector circuit that identifies an attack on the integrated circuit, comprising:
  a transmitting device that transmits predetermined test data into the security-critical circuit components arranged in the lower plane;
  a receiving device that receives the data processed by the security-critical circuit components arranged in the lower plane; and
  an evaluation device that compares the received data with expected data and ascertains any non-correspondence,
wherein the data lines carry data that is necessary during the processing of transmitted data.

7. The integrated circuit according to claim 6, further comprising a test key, which is stored in a key register and encrypts the test data.

8. The integrated circuit according to claim 6, wherein the transmitter transmits the predetermined test data in cyclic intervals.

9. The integrated circuit according to claim 6, wherein the transmitter transmits the predetermined test data at irregular time intervals.

10. The integrated circuit according to claim 6, wherein the encryption device is a DES encryption device.

11. An integrated circuit comprising:
security-critical circuit components arranged in a lower plane;
data lines arranged in an upper plane, situated at least in part above the security-critical circuit components arranged in the lower plane, and connected to the security-critical circuit components; and
a detector means for identifying an attack on the integrated circuit, comprising:
  a transmitting means for transmitting predetermined test data into the security-critical circuit components arranged in the lower plane;
  a receiving means for receiving the data processed by the security-critical circuit components arranged in the lower plane; and
  an evaluation means for comparing the received data with expected data and that ascertains any non-correspondence,
wherein the integrated circuit is operable in a normal mode and a test mode,
the data lines carry the predetermined test data that is transmitted by the transmitting means and is processed by the security-critical circuit components in the test mode, and
the data lines carry data that is processed by the security critical circuit components in the normal mode.

12. An integrated circuit comprising:
security-critical circuit components arranged in a lower plane, which are parts of an encryption device;
data lines arranged in an upper plane, situated at least in part above the security-critical circuit components arranged in the lower plane, and connected to the security-critical circuit components;
a memory, in which second data that is necessary to encrypt first data is stored, connected by the data lines to processing units, which combine the first data with the second data and a key; and
a detector means for identifying an attack on the integrated circuit, comprising:
  a transmitting means for transmitting predetermined test data into the security-critical circuit components arranged in the lower plane;
  a receiving means for receiving the data processed by the security-critical circuit components arranged in the lower plane; and
  an evaluation means for comparing the received data with expected data and that ascertains any non-correspondence,
wherein the data lines carry the first data that is necessary during the processing of transmitted data.

* * * * *

UNITED STATES PATENT AND TRADEMARK OFFICE
CERTIFICATE OF CORRECTION

PATENT NO. : 6,962,294 B2
DATED : November 8, 2005
INVENTOR(S) : Andrea Beit-Grogger et al.

It is certified that error appears in the above-identified patent and that said Letters Patent is hereby corrected as shown below:

Title page,
Item [73], Assignee, delete "Infineon Technologie AG, Munich (DE)" and substitue -- Infineon Technologies AG, Munich (DE) --.

Signed and Sealed this

Seventh Day of February, 2006

JON W. DUDAS
*Director of the United States Patent and Trademark Office*